(12) United States Patent
Piering (10) Patent No.: US 12,092,437 B1
(45) Date of Patent: Sep. 17, 2024

(54) FIRING CIRCUIT AND RELATED METHOD FOR OPERATING A FIRING CIRCUIT

(71) Applicant: Reynolds Systems, Inc., Middletown, CA (US)

(72) Inventor: Fred E. Piering, Maitland, FL (US)

(73) Assignee: Reynolds Systems, Inc., Middletown, CA (US)

( * ) Notice: Subject to any disclaimer, the term of this patent is extended or adjusted under 35 U.S.C. 154(b) by 43 days.

(21) Appl. No.: 18/113,148

(22) Filed: Feb. 23, 2023

Related U.S. Application Data (60) Provisional application No. 63/313,334, filed on Feb. 24, 2022.

(51) Int. Cl.
*F42B 3/12* (2006.01)
*H02J 7/34* (2006.01)
*H03K 17/56* (2006.01)

(52) U.S. Cl.
CPC .............. *F42B 3/121* (2013.01); *F42B 3/124* (2013.01); *H02J 7/345* (2013.01); *H03K 17/56* (2013.01)

(58) Field of Classification Search
CPC .... F42B 3/12; F42B 3/13; F42B 3/121; F42B 3/124; F42B 3/21; F42B 3/24; H02J 7/345; H03K 17/56
USPC ........................................................ 102/218
See application file for complete search history.

(56) References Cited

U.S. PATENT DOCUMENTS

| | | | | |
|---|---|---|---|---|
| 4,651,646 A | * | 3/1987 | Foresman | F42C 11/04 102/206 |
| 6,138,571 A | * | 10/2000 | Denney | F42C 11/008 102/206 |
| 6,389,975 B1 | * | 5/2002 | Haddon | F42C 11/008 102/202.8 |
| 6,634,298 B1 | * | 10/2003 | Denney | F42B 3/10 102/206 |
| 6,923,122 B2 | | 8/2005 | Hennings et al. | |
| 7,334,523 B2 | * | 2/2008 | Lucas | F42B 3/18 102/202.7 |
| 7,430,963 B2 | | 10/2008 | Hennings et al. | |
| 7,581,496 B2 | | 9/2009 | Hennings et al. | |
| 7,690,303 B2 | | 4/2010 | Reynolds et al. | |
| 8,100,043 B1 | | 1/2012 | Nance et al. | |
| 8,276,516 B1 | | 10/2012 | Nance et al. | |
| 8,408,131 B1 | | 4/2013 | Nance | |
| 8,485,097 B1 | | 7/2013 | Nance et al. | |
| 8,573,122 B1 | | 11/2013 | Nance et al. | |
| 8,726,808 B1 | | 5/2014 | Nance | |
| 9,038,538 B1 | | 5/2015 | Nance et al. | |
| 9,500,448 B1 | | 11/2016 | Nance et al. | |
| 10,267,605 B1 | | 4/2019 | Meadows | |
| 10,345,084 B1 | | 7/2019 | Nance et al. | |
| 10,605,576 B1 | | 3/2020 | Nance et al. | |
| 10,871,354 B2 | | 12/2020 | Amendola et al. | |
| 10,935,352 B1 | | 3/2021 | Nance et al. | |
| 11,009,319 B1 | | 5/2021 | Morales et al. | |
| 11,448,487 B1 | | 9/2022 | Morales et al. | |
| 11,525,653 B1 | | 12/2022 | Nance et al. | |

(Continued)

*Primary Examiner* — Joshua E Freeman
*Assistant Examiner* — Benjamin S Gomberg
(74) *Attorney, Agent, or Firm* — Reising Ethington P.C.

(57) ABSTRACT

A firing circuit for operating an exploding foil initiator that employs a transistor to control the transmission of electrical energy from an electrical energy storage device to a bridge of the exploding foil initiator.

14 Claims, 5 Drawing Sheets

(56) References Cited

U.S. PATENT DOCUMENTS

2010/0282105 A1* 11/2010 Neyer ................ F42B 3/18
                                                          102/202.1
2015/0040786 A1* 2/2015 Overbey ............. F42C 19/12
                                                          102/202.7

\* cited by examiner

FIRING CIRCUIT AND RELATED METHOD FOR OPERATING A FIRING CIRCUIT

CROSS-REFERENCE TO RELATED APPLICATIONS

This application claims the benefit of U.S. Provisional Patent Application No. 63/313,334 filed Feb. 24, 2022, the disclosure of which is incorporated by reference as if fully set forth in detail herein.

FIELD

The present disclosure relates to a firing circuit and a related method for operating a firing circuit.

BACKGROUND

The integration of exploding foil initiators into systems for detonating weapons, initiating combustion in a rocket motor, or initiating the operation of an actuator has greatly increased the safety and reliability of these systems. One drawback with exploding foil initiators concerns the delivery of the power to the bridge of the exploding foil initiator to cause the bridge to vaporize and develop sufficient pressure to shear a flyer, propel the flyer through a barrel of the exploding foil initiator so that it contacts an input charge with sufficient energy to detonate the input charge. Typically, the electrical power needed to operate an exploding foil initiator needs to be delivered to the bridge over a span that is less than 100 nano-seconds, and will typically involve over 1,000 amps at a voltage that exceeds 1,000 volts.

In view of the need to deliver the relatively high amount of energy that is needed in a practically instantaneous manner, it was relatively common for a firing circuit to employ a silicon controlled rectifier (SCR) device to selectively transmit the electrical power to the bridge of the exploding foil initiator. Unfortunately, an appropriate SCR device for use in the firing circuit of an exploding foil initiator can be relatively expensive. Accordingly, there is a need in the art for a firing circuit for an exploding foil initiator that does not rely on an SCR device to provide electrical energy to the bridge of the exploding foil initiator to thereby reduce the cost of the firing circuit relative to prior art firing circuits.

SUMMARY

This section provides a general summary of the disclosure, and is not a comprehensive disclosure of its full scope or all of its features.

In one form, the present disclosure provides a firing circuit that includes an electrical energy storage device, a transformer, a first transistor, a second transistor, and a second capacitor. The electrical energy storage device includes a first capacitor and an exploding foil initiator. The first capacitor has a first capacitor terminal, which is configured to be electrically coupled to a source of high voltage DC electric power, and a second capacitor terminal. The exploding foil initiator has a first initiator terminal, which is electrically coupled to the second capacitor terminal, a second initiator terminal, which is electrically coupled to the electrical ground, and a bridge element that is disposed between and electrically coupled to the first and second initiator terminals. The transformer has a primary coil and a secondary coil. The primary coil has a positive leg that is configured to be electrically coupled to a source of low voltage DC electric power. The first transistor is operated by the secondary coil of the transformer to electrically couple the first capacitor terminal to the electrical ground. The second transistor is disposed between a negative leg of the primary coil and the electrical ground. The second transistor is operable in a first state and a second state. The second transistor electrically isolates the negative leg of the primary coil from the electrical ground when the second transistor is operated in the first state. The second transistor couples the negative leg of the primary coil to the electrical ground when the second transistor is operated in the second state. The second capacitor is electrically coupled to the negative leg of the primary coil of the transformer and the electrical ground.

In another form, the present disclosure provides a method that includes: providing a firing circuit having an electrical energy storage device, and a first transistor, the electrical energy storage device having a first capacitor and an exploding foil initiator, the first capacitor having a first capacitor terminal and a second capacitor terminal, the exploding foil initiator having a first initiator terminal, which is electrically coupled to the second capacitor terminal, a second initiator terminal, which is electrically coupled to an electrical ground, and a bridge element that is disposed between and electrically coupled to the first and second initiator terminals; charging the first capacitor terminal while grounding the second capacitor terminal along a ground path that include the first initiator terminal, the bridge element and the second initiator terminal; and operating the first transistor to couple the first capacitor terminal to the electrical ground such that electrical power stored in the first capacitor is discharged through the first capacitor terminal of the first capacitor and the first transistor to the electrical ground to thereby cause electrical power to flow from the electrical ground through the bridge element and vaporize the bridge element.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
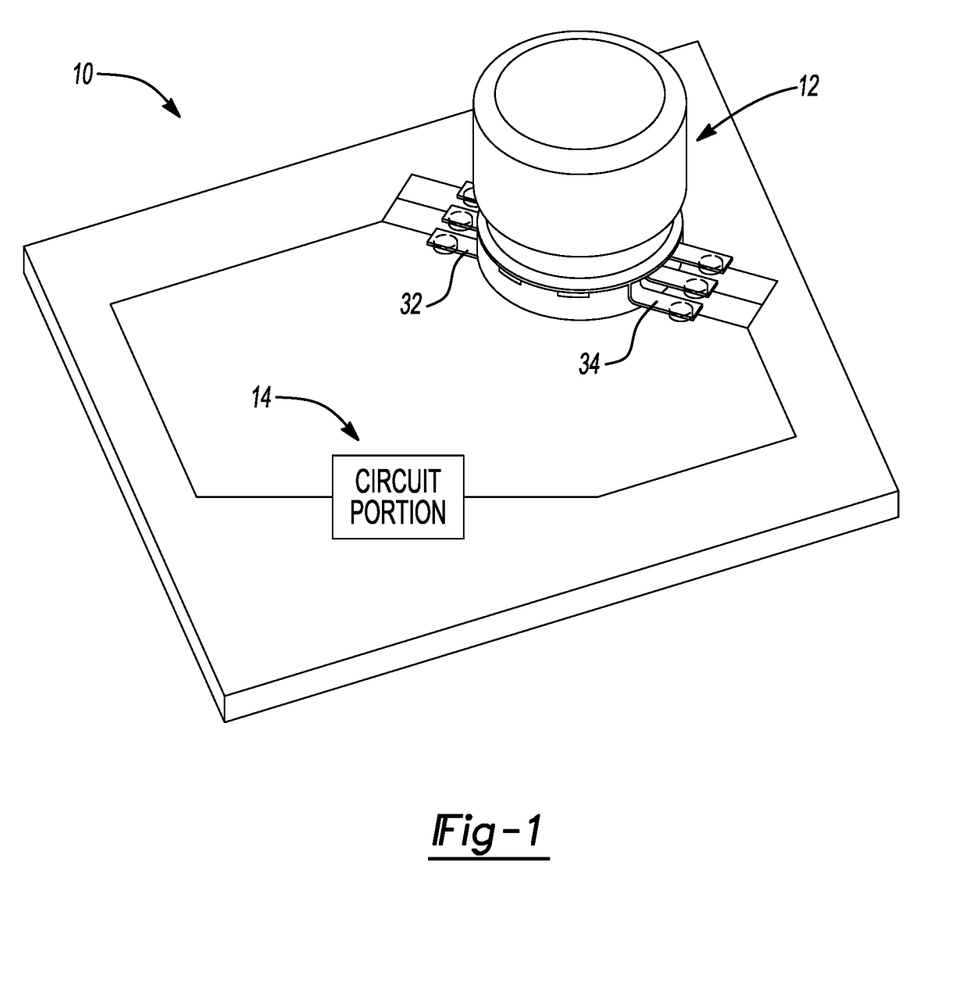
FIG. 1 is a schematic illustration of an exemplary firing circuit constructed in accordance with the teachings of the present disclosure.

With reference to FIG. 1 of the drawings, an exemplary firing circuit is generally indicated by reference numeral 10. The firing circuit 10 can include an exploding foil initiator 12 and a circuit portion 14.

Figure 2:
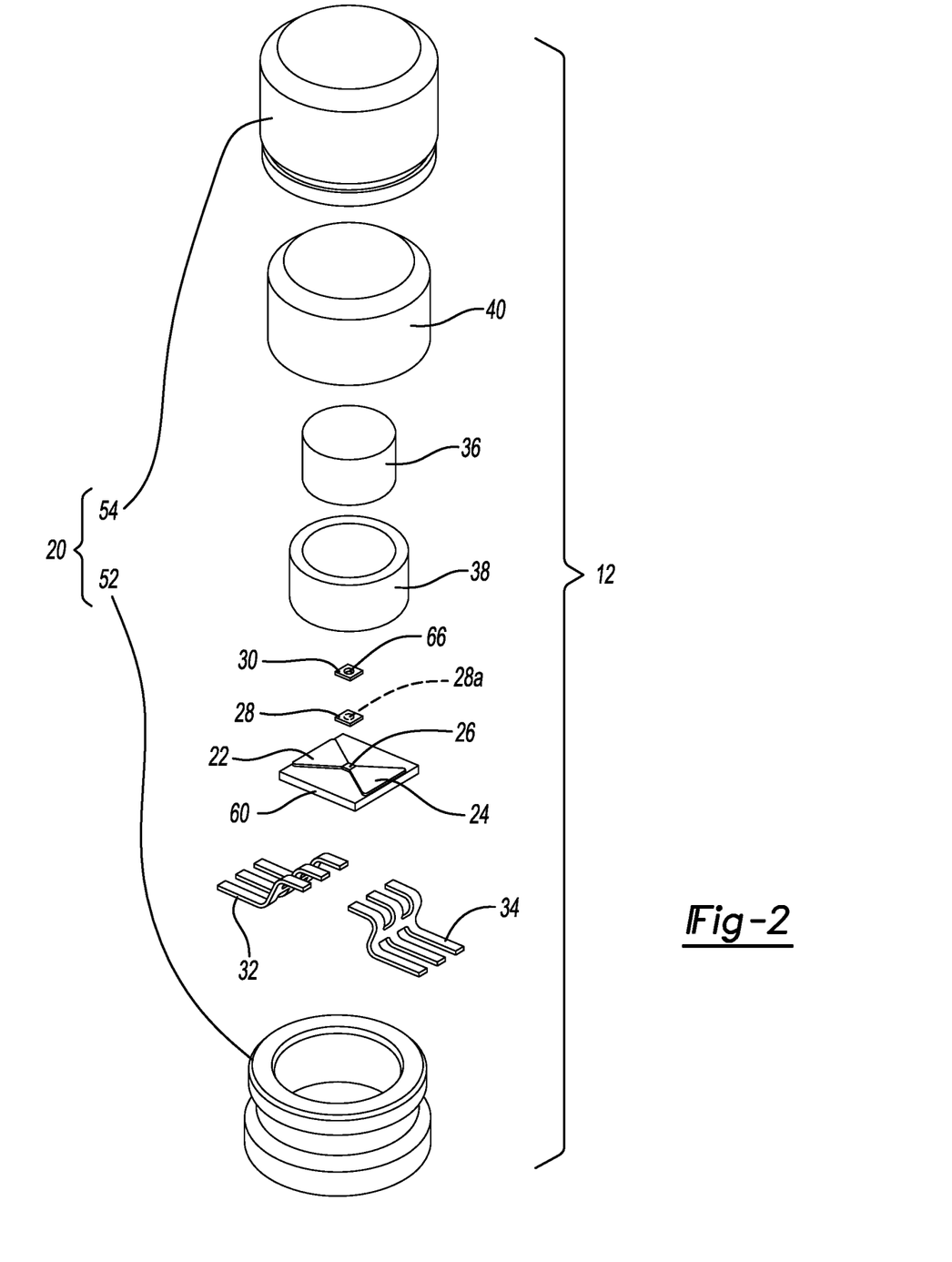
FIG. 2 is an exploded perspective view of a portion of the firing circuit of FIG. 1, illustrating an exploding foil initiator in more detail.

With reference to FIG. 2, the exploding foil initiator 12 can be constructed in a convention manner and can include a housing 20, a first initiator terminal 22, a second initiator terminal 24, a bridge 26, a flyer layer 28, a barrel 30, first and second initiator contacts 32 and 34, respectively, and an input charge 36. Optionally, the exploding foil initiator 12 can also include one or more of an input sleeve 38 and an output charge 40.

The housing 20 can define a cavity 50 into which the first and second initiator terminals 22 and 24, the bridge 26, the flyer layer 28, the barrel 30, the input charge 36, and if included, the input sleeve 38 and the output charge 40 can be received. In the example provided, the housing 20 includes a housing member 52 and a cover 54 that is fitted over and secured to the housing member 52.

The first and second initiator terminals 22 and 24 and the bridge 26 can be mounted or formed on a base 60 that is formed from a suitable structural material. For example, the base 60 can be formed of a suitable ceramic material and the first and second initiator terminals 22 and 24 and the bridge 26 can be formed through vapor deposition of one or more materials onto a surface of the base 60.

The flyer layer 28 can be fixedly coupled to the bridge 26 so as to overlie the bridge 26 on a side of the bridge 26 that is opposite the base 60. The flyer layer 28 can be formed of a suitable material, such as polyamide.

The barrel 30 can be formed as a discrete layer that can be disposed over the flyer layer 28 (i.e., on a side of the flyer layer 28 that is opposite the bridge 26). The barrel 30 can be formed of any suitable material, such as polyamide. Optionally, the barrel 30 could be formed with the housing member 52 in an embodiment where the housing member 52 is formed of an injection molded plastic material and the base 60, first and second initiator terminals 22 and 24, flyer layer 28 and the first and second initiator contacts 32 and 34 are (partly) encapsulated in the injection molded plastic material. The barrel 30 can define a barrel aperture 66 that extends through the opposite axial ends of the barrel 30 and is disposed in-line with the flyer layer 28 and the bridge 26.

The first and second initiator contacts 32 and 34 are configured to electrically and mechanically couple the first and second initiator terminals 22 and 24, respectively, to the circuit portion 14. In the example provided, the first and second initiator contacts 32 and 34 are soldered to the first and second initiator terminals 22 and 24 and are partly encapsulated in the housing member 52.

The input charge 36 can be formed of a suitable energetic material, such as a secondary explosive material, and can be disposed in-line with the bridge 26 on a side of the barrel 30 that is opposite the flyer layer 28. The input charge 36 could be abutted against the barrel 30, or in the alternative, one or more layers (not shown) of material may be disposed between the barrel 30 and the input charge 36, for example to inhibit particles of the input charge 36 from moving through the barrel aperture 66 onto the flyer layer 28. If an input sleeve 38 is included, the input charge 36 can be mounted into (e.g., press-fit into) the input sleeve 38 and the input sleeve 38 can be received in the cavity 50 of the housing 20. The input sleeve 38 can be a hollow tubular structure and can be formed of a suitable material, such as steel, tungsten, or aluminum. The input sleeve 38 can be spaced apart from the first and second initiator terminals 22 and 24 so that electrical energy is not transmitted from one of the first and second initiator terminals 22 and 24 through the input sleeve 38 to the other one of the first and second initiator terminals 22 and 24. Optionally, an electrically insulating material may extend over portions of the first and second initiator terminals 22 and 24 that are in-line with the input sleeve 38. Also optionally, the barrel 30 could extend over the first and second initiator terminals 22 and 24 and can form an electrically insulating layer that is disposed between the input sleeve 38 and the first and second initiator terminals 22 and 24.

If included, the output charge 40 can be received in the cavity 50 on a side of the input charge 36 that is opposite the barrel 30. The output charge 40 can be formed of a suitable energetic material, such as a secondary explosive material or a material that is configured to combust or deflagrate, depending on the particular output of the exploding foil initiator 12 that is desired. It will be appreciated that the output charge 40 could be segregated from the input charge 36 to one degree or another. For example, one or more layers of material or barriers could be placed between the input charge 36 and the output charge 40, the output charge 40 could be disposed in a container or cup-like structure, or the housing 20 could be configured with an interior bulkhead that separates the cavity 50 into two discrete components (one into which the input charge 36 is received, and another into which the output charge 40 is received).

The cover 54 of the housing 20 can be fixedly coupled to the housing member 52 in any desired manner, such as through crimping, welding, threads, or adhesives. Optionally, the cover 54 can be assembled to the housing member 52 so that a compressive force is applied to some or all of the components of the exploding foil initiator 12 that are disposed in the cavity 50. In such case, the compressive force can be at least partly maintained when the cover 54 is fixedly coupled to the housing member 52.

It will be appreciated that operation of the exploding foil initiator 12 entails the rapid transmission of high-power electrical energy across the first and second initiator terminals 22 and 24 to cause the bridge 26 to vaporize (i.e., form a plasma). Pressure created by the vaporization of the bridge 26 shears a disc-shaped flyer 28a from the flyer layer 28, which is sized to the diameter of the barrel aperture 66, and propels the flyer 28a through the barrel aperture 66 where it strikes/impacts the component of the exploding foil initiator 12 that is abutted against the side of the barrel 30 that is opposite the flyer layer 28 (i.e., the input charge 36 or the material/layer/barrier that is disposed between the input charge 36 and the barrel 30). A shockwave that is produced by the impact of the flyer 28a is produced in or transmitted to the input charge 36 and has sufficient energy to cause the input charge 36 to detonate. The energy of the detonating input charge 36 can be the output of the exploding foil initiator 12 in situations where the exploding foil initiator 12 does not include an output charge. Alternatively, the energy from the detonating input charge 36 can be transmitted through any layers and/or barriers to create a desired reaction in the output charge 40. A shockwave produced by the detonation of the input charge 36 is employed to induce detonation of the output charge 40. Alternatively, layers and/or barriers between the input charge 36 and the output charge 40 can interact with the energy that is produced by the detonating input charge 36 to generate heat that is employed to induce combustion or deflagration of the output charge 40 in instances where the exploding foil initiator 12 is intended to initiate combustion or deflagration rather than detonation.

Figure 3:
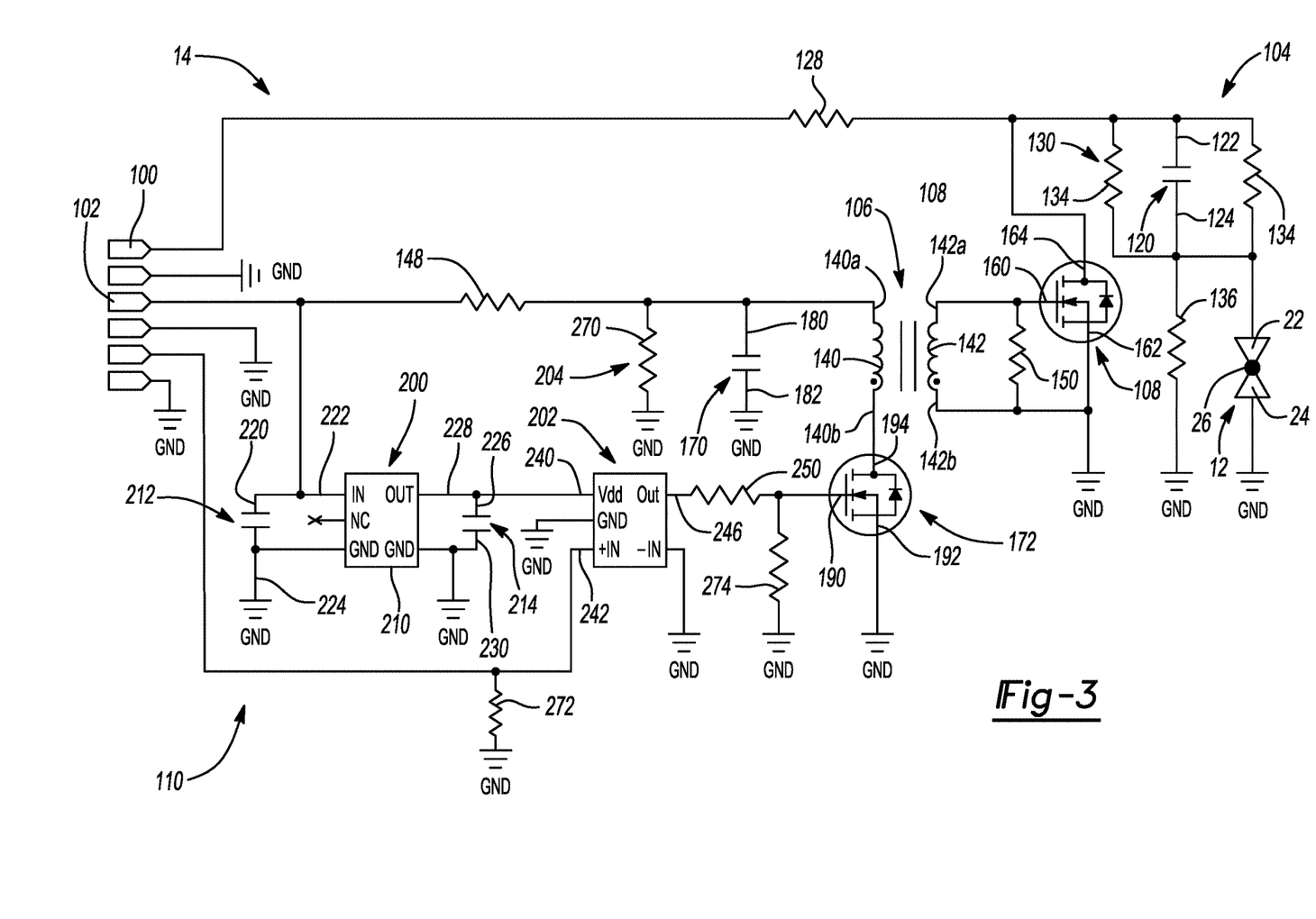
FIG. 3 is a wiring schematic illustration of the firing circuit of FIG. 1.

With reference to FIG. 3, the circuit portion 14 is configured to provide sufficient electrical energy to the bridge 26 in a sufficiently short amount of time that permits the bridge 26 to vaporize sufficiently fast so that the flyer 28a (FIG. 2) is sheared from the flyer layer 28 (FIG. 2) and is able to travel through the barrel aperture 66 (FIG. 2) at a velocity that is sufficient to produce a shockwave of a desired magnitude.

The circuit portion 14 may include a first power source 100, a second power source 102, an electrical energy storage device 104, a transformer 106, a first transistor 108, and an arming circuit 110.

The first power source 100 is configured to provide high voltage direct current (DC) electric power. In the example provided, the first power source 100 provides electrical power with 1200 volts of electrical potential and a maximum current of about 15 milliamperes.

The second power source 102 is configured to provide low voltage DC electric power. In the example provided, the second power source 102 provides electrical power with 24 volts of electrical potential and a maximum current of about 50 milliamperes.

The electrical energy storage device 104 includes a first capacitor 120 and the exploding foil initiator 12. The first capacitor 120 has a first capacitor terminal 122, which is electrically coupled to the first power source 100, and a second capacitor terminal 124. The first initiator terminal 22 of the exploding foil initiator 12 is electrically coupled to the second capacitor terminal 124, while the second initiator terminal 24 is electrically coupled to an electrical ground GND. As noted above, the bridge 26 is disposed between and electrically coupled to the first and second initiator terminals 22 and 24. Optionally, the electrical energy storage device 104 could include a first resistor 128, which can be disposed in series between the first power source 100 and the first capacitor terminal 122 of the first capacitor 120. Also optionally, the electrical energy storage device 104 could include a discharge circuit 130 that electrically couples the first capacitor terminal 122 of the first capacitor 120 to the electrical ground GND. The discharge circuit 130 can include one or more second resistors 134 and a third resistor 136. Each of the second resistors 134 can electrically connect the first capacitor terminal 122 of the first capacitor 120 to the first initiator terminal 22 and to the second capacitor terminal 102 of the first capacitor 120. The third resistor 136 can electrically connect the second capacitor terminal 102 of the first capacitor 120 and the first initiator terminal 22 to the electrical ground GND.

The transformer 106 is configured to provide electrical isolation between the second power source 102 and the first transistor 108. The transformer 106 can be any type of transformer, such as an isolation transformer or a step-up transformer, and can have a primary coil 140 and a secondary coil 142. The primary coil 140 can have a positive leg 140a, which can be electrically coupled to the second power source 102 and a negative leg 140b that can be electrically coupled to the arming circuit 110 as will be discussed in detail below. Optionally, a fourth resistor 148 can be disposed in series between the second power source 102 and the positive leg 140a of the primary coil 140. The secondary coil 142 of the transformer 106 can have a positive leg 142a and a negative leg 142b. The negative leg 142b of the primary coil 140 can be electrically coupled to the electrical ground GND. Optionally, a fifth resistor 150 can be disposed between and electrically connect the positive and negative legs 142a and 142b of the secondary coil 142.

The first transistor 108 can be operated by the transformer 106 to electrically couple the first capacitor terminal 122 of the first capacitor 120 to the electrical ground GND. The first transistor 108 can be any type of transistor, such as a bipolar junction transistor (BJT), an insulated gate bipolar transistor (IGBT) or a field effect transistor (FET). If the first transistor 108 is a FET as is shown in FIG. 3, it could be a junction field effect transistor (JFET), a metal-oxide semiconductor field effect transistor (MOSFET), or a silicon carbide field effect transistor (SIC FET), such as a silicon carbide field effect transistor (SIC MOSFET), for example. In the particular example provided, the first transistor 108 is a SiC MOSFET having a gate 160, a source 162 and a drain 164. The gate 160 is electrically coupled to the positive leg 142a of the secondary coil 142, the source 162 is electrically coupled to both the negative leg 142b of the secondary coil 142 and the electrical ground GND, and the drain 164 is electrically coupled to the first capacitor terminal 122 of the first capacitor 120 at a location where current passing between the drain 164 and the first capacitor terminal 122 of the first capacitor 120 does not pass through the first resistor 128.

Figure 4:
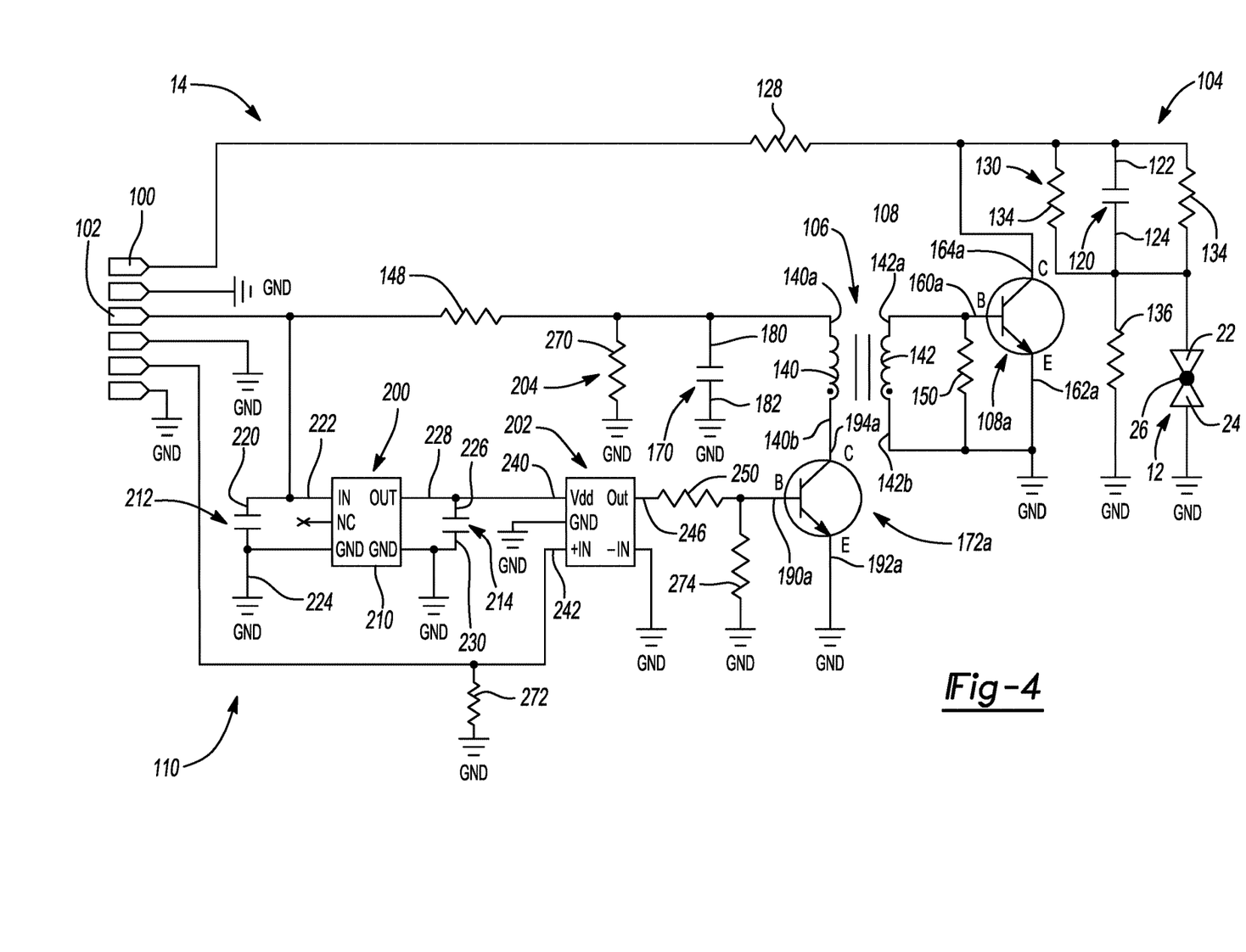
FIG. 4 is a wiring schematic that is similar to that of FIG. 3 but illustrating the firing circuit with bipolar junction transistors.
Figure 5:
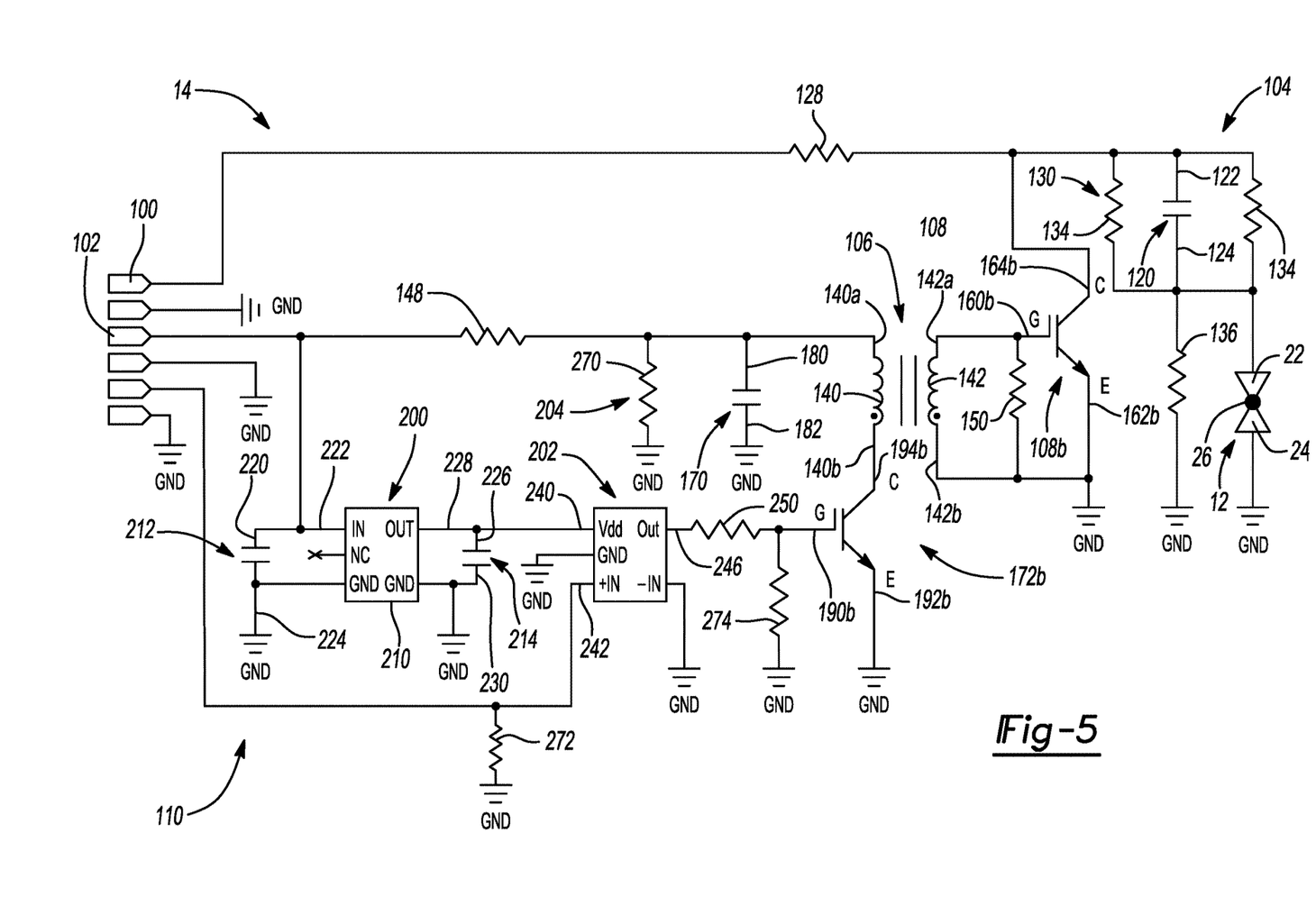
FIG. 5 is a wiring schematic that is similar to that of FIG. 3 but illustrating the firing circuit with insulated gate bipolar transistors.

Alternatively, the first transistor could be a bipolar junction transistor (BJT) as shown in FIG. 4 or an insulated gate bipolar transistor (IGBT) as shown in FIG. 5. With regard to FIG. 4, the first transistor 108a has a gate 160a, an emitter 162a and a collector 164a. The gate 160a is electrically coupled to the positive leg 142a of the secondary coil 142, the emitter 162a is electrically coupled to both the negative leg 142b of the secondary coil 142 and the electrical ground GND, and the collector 164a is electrically coupled to the first capacitor terminal 122 of the first capacitor 120 at a location where current passing between the collector 164a and the first capacitor terminal 122 of the first capacitor 120 does not pass through the first resistor 128. In the example of FIG. 5, the first transistor 108b has a gate 160b, an emitter 162b and a collector 164b. The gate 160b is electrically coupled to the positive leg 142a of the secondary coil 142, the emitter 162b is electrically coupled to both the negative leg 142b of the secondary coil 142 and the electrical ground GND, and the collector 164b is electrically coupled to the first capacitor terminal 122 of the first capacitor 120 at a location where current passing between the collector 164b and the first capacitor terminal 122 of the first capacitor 120 does not pass through the first resistor 128.

The arming circuit 110 can include a second capacitor 170 and a second transistor 172. The second capacitor 170 can electrically couple the negative leg 140b of the primary coil 140 of the transformer 106 and the electrical ground GND. The second capacitor 170 can have a first capacitor terminal 180, which can be electrically coupled to the second power source 102 and the positive leg 140a of the primary coil 140 of the transformer 106, and a second capacitor terminal 182 that can be electrically coupled to the electrical ground GND.

The second transistor 172 can be disposed between the negative leg 140b of the primary coil 140 and the electrical ground GND and is operable in a first state, in which the second transistor 172 electrically isolates the negative leg 140b of the primary coil 140 from the electrical ground GND, and a second state in which the second transistor 172 couples the negative leg 140b of the primary coil 140 to the electrical ground GND. The second transistor 172 can be any type of transistor, such as a bipolar junction transistor (BJT), an insulated gate bipolar transistor (IGBT) or a field effect transistor (FET). If the second transistor 172 is a FET, it could be a junction field effect transistor (JFET), a metal-oxide semiconductor field effect transistor (MOSFET), or a silicon carbide field effect transistor (SIC FET), such as a silicon carbide field effect transistor (SiC MOSFET), for example. In the particular example provided, the second transistor 172 is a SiC MOSFET having a gate 190, a source 192 and a drain 194. The gate 190 is configured to be selectively coupled to the second power source 102, the source 192 is electrically coupled to the electrical ground GND, and the drain 194 is electrically coupled to the negative leg 140b of the primary coil 140 of the transformer 106.

Alternatively, the second transistor could be a bipolar junction transistor (BJT) as shown in FIG. 4 or an insulated gate bipolar transistor (IGBT) as shown in FIG. 5. With regard to FIG. 4, the second transistor 172a has a gate 190a, an emitter 192a and a collector 194a. The gate 190a is configured to be selectively coupled to the second power source 102, the emitter 192a is electrically coupled to the electrical ground GND, and the collector 194a is electrically coupled to the negative leg 140b of the primary coil 140 of the transformer 106. With regard to FIG. 5, the second transistor 172b has a gate 190b, an emitter 192b and a collector 194b. The gate 190b is configured to be selectively coupled to the second power source 102, the emitter 192b is electrically coupled to the electrical ground GND, and the collector 194b is electrically coupled to the negative leg 140b of the primary coil 140 of the transformer 106.

Optionally the arming circuit 110 can further include a power conditioning portion 200, a logic gate portion 202 and/or a power dissipation portion 204. The power conditioning portion 200 can include a voltage regulator integrated circuit 210, a third capacitor 212 and a fourth capacitor 214. The voltage regulator integrated circuit 210 is configured to work in conjunction with the third and fourth capacitors 212 and 214 to apply a predetermined voltage to an input of the logic gate portion 202 as will be discussed in greater detail below. The third capacitor 212 has a first capacitor terminal 220, which is electrically coupled to both the second power source 102 and an input 222 of the voltage regulator integrated circuit 210, and a second capacitor terminal 224 that is electrically coupled to the electrical ground GND. The fourth capacitor 214 has a first capacitor terminal 226, which is electrically coupled to the output 228 of the voltage regulator integrated circuit 210, and a second capacitor terminal 230 that is electrically coupled to the electrical ground GND.

The logic gate portion 202 has a first logic gate input 240, a second logic gate input 242 and a logic gate output 246. The first logic gate input 240 is electrically coupled to the first capacitor terminal 226 of the fourth capacitor 214 and to the output 228 of the voltage regulator integrated circuit 210. The second logic gate input 242 is configured to receive a trigger signal that is indicative of a desire to operate the exploding foil initiator 12. The logic gate output 246 is electrically coupled to the gate 190 of the second transistor 172. The logic gate portion 202 can be configured to selectively transmit the input that is received by the first logic gate input 240 (i.e., the voltage that is output over the output 228 of the voltage regulator integrated circuit 210) to the logic gate output 246. In the particular example provided, the logic gate portion 202 inhibits the transmission of electrical energy from the first logic gate input 240 to the logic gate output 246 unless a firing signal of a first predetermined voltage is applied to the second logic gate input 242, and the voltage that is applied to the first logic gate input 240 is greater than or equal to a second predetermined voltage. Optionally, a sixth resistor 250 can be disposed in series between the logic gate output 246 and the gate 190 of the second transistor 172.

The power dissipation portion 204 can include one or more resistors that are configured to couple portions of the arming circuit 110 to the electrical ground. For example, the power dissipation portion 204 can include a seventh resistor 270, which can electrically couple the first capacitor terminal 180 of the second capacitor 170 to the electrical ground GND, an eighth resistor 272, which can electrically couple the second logic gate input 242 to the electrical ground GND, and/or a ninth resistor 274 that can electrically couple the gate 190 of the second transistor 172 to the electrical ground GND.

To arm the firing circuit 10, electrical energy is provided by the first power source 100 to the electrical energy storage device 104 to charge the first capacitor 120, while electrical energy is provided by the second power source 102 to the arming circuit 110 to charge the second, third and fourth capacitors 170, 212 and 214. It should be noted that the magnitude of the resistance of the second resistor(s) 134 of the discharge circuit 130 and the seventh resistor 270 of the power dissipation portion 204 is relatively large. With the firing circuit in the armed condition or state, no (or relatively little) electrical energy is applied to the gate 190 of the second transistor 172, and as such, no electrical energy is able to flow between the source 192 and the drain 194 of the second transistor 172. Consequently, the negative leg 140b of the primary coil 140 of the transformer 106 is not electrically coupled to the electrical ground GND, which prevents the transformer 106 from producing electrical energy in the secondary coil 142 that is needed to operate the first transistor 108. As such, no electrical energy is able to flow between the source 162 and the drain 164 of the first transistor 108 so that the first capacitor terminal 122 is not electrically coupled to the electrical ground GND.

The trigger signal (i.e., an electric signal of a first predetermined voltage) can be applied to the second logic gate input 242 when the firing circuit 10 is in the armed condition to initiate the operation of the exploding foil initiator 12. Application of the trigger signal to the second logic gate input 242 when the firing circuit 10 is in the armed state causes the logic gate portion 202 to transmit electrical energy from the first logic gate input 240 to the logic gate output 246. It will be appreciated that electrical energy that is output from the logic gate portion 202 (through the logic gate output 246) is applied to the gate 190 of the second transistor 172. Preferably, the electrical energy that is applied to the gate 190 is sufficient to cause the second transistor 172 to transmit electrical energy between the source 192 and the drain 194 to the fullest potential of the second transistor 172 so that maximum power flows through the primary coil 140 of the transformer 106, the second transistor 172 and to the electrical ground GND upon the application of electrical energy to the gate 190 of the second transistor 172 from the logic gate portion 202. The flow of electrical energy through the primary coil 140 of the transformer 106 causes a corresponding flow of electrical energy through the secondary coil 142 of the transformer 106 so that electrical energy is applied to the gate 160 of the first transistor 108 so that electrical power can be transmitted between the source 162 and the drain 14 of the first transistor 180. Preferably, the electrical energy that is applied to the gate 160 is sufficient to cause the first transistor 108 to transmit electrical energy between the source 162 and the drain 164 to the fullest potential of the first transistor 108. The operation of the first transistor 108 permits electrical energy from the first capacitor terminal 122 of the first capacitor 120 to be electrically coupled (via the first transistor 108) to the electrical ground GND. Rapid discharge of the electrical energy stored in the first transistor 108 to the electrical ground GND is applied to the second initiator terminal 24 and passed through the bridge 26 to the first initiator terminal 24, which vaporizes the bridge 26 and thereby operate the exploding foil initiator 12.

In situations where the firing circuit 10 is powered down from the armed condition without operating the exploding foil initiator 12 (i.e., electrical power from the first power source 100 is removed from the electrical energy storage device 104 and electrical power from the second power source 102 is removed from the arming circuit 110), it can be desirable to eliminate electrical charges on components of the firing circuit 10. For example, the discharge circuit 130 permits electrical energy stored in the first capacitor 120 to drain to the electrical ground GND over a desired period of time, such as 20 minutes. Similarly, the power dissipation portion 204 can be employed to drain electrical energy from all or portions of the arming circuit 110. In this regard, the seventh resistor 270 permits electrical energy stored in the second capacitor 170 to drain to the electrical ground GND over a desired period of time, such as 20 minutes. The eighth and ninth resistors 272 and 274 similarly permit electrical energy on the second logic gate input 242 and the gate 190 to drain to the electrical ground GND over a desired period of time. It will be appreciated, too, that the fifth resistor 150 can permit electrical energy on the gate 160 of the first transistor 108 to drain to the electrical ground over a desired period of time.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A firing circuit comprising:
    an electrical energy storage device that includes a first capacitor and an exploding foil initiator, the first capacitor having a first capacitor terminal, which is adapted to be electrically coupled to a first power source that is configured to provide high voltage DC electric power, and a second capacitor terminal, the exploding foil initiator having a first initiator terminal, which is electrically coupled to the second capacitor terminal, a second initiator terminal, which is electrically coupled to an electrical ground, and a bridge element that is disposed between and electrically coupled to the first and second initiator terminals;
    a transformer having a primary coil and a secondary coil, the primary coil having a positive leg that is adapted to be coupled to a second power source that is configured to provide low voltage DC electric power;
    a first transistor that is operated by the secondary coil of the transformer to electrically couple the first capacitor terminal to the electrical ground;
    a second transistor disposed between a negative leg of the primary coil and the electrical ground, the second transistor being operable in a first state and a second state, wherein the second transistor electrically isolates the negative leg of the primary coil from the electrical ground when the second transistor is operated in the first state, and wherein the second transistor couples the negative leg of the primary coil to the electrical ground when the second transistor is operated in the second state; and
    a second capacitor that is electrically coupled to the positive leg of the primary coil of the transformer and the electrical ground.

2. The firing circuit of claim 1, wherein the first transistor is a field effect transistor (FET).

3. The firing circuit of claim 2, wherein the first transistor is a metal-oxide-semiconductor field effect transistor (MOSFET).

4. The firing circuit of claim 2, wherein the first transistor is a junction field effect transistor (JFET).

5. The firing circuit of claim 2, wherein the first transistor is a silicon carbide field effect transistor (SiC FET).

6. The firing circuit of claim 1, wherein the first transistor is a bipolar junction transistor (BJT).

7. The firing circuit of claim 1, wherein the exploding foil initiator further comprises a barrel, a flyer layer and an input charge, the barrel being disposed over the bridge, the flyer layer being disposed between the bridge and the barrel, the input charge being disposed on a side of the barrel opposite the flyer layer.

8. The firing circuit of claim 1, further comprising a capacitive discharge circuit coupling the positive leg of the transformer to the electrical ground.

9. The firing circuit of claim 8, wherein the capacitive discharge circuit includes a first discharge resistor that is electrically coupled to the positive leg of the transformer and the electrical ground in parallel with the second capacitor.

10. The firing circuit of claim 1, further comprising a capacitive discharge circuit coupling the first capacitor terminal of the first capacitor to the electrical ground.

11. The firing circuit of claim 10, wherein the discharge circuit includes a first resistor and a second resistor, wherein the first capacitor terminal is grounded through the first resistor, and wherein the second capacitor terminal is grounded through the second resistor.

12. A method comprising:
    providing a firing circuit having an electrical energy storage device, and a first transistor, the electrical energy storage device having a first capacitor and an exploding foil initiator, the first capacitor having a first capacitor terminal and a second capacitor terminal, the exploding foil initiator having a first initiator terminal, which is electrically coupled to the second capacitor terminal, a second initiator terminal which is electrically coupled to an electrical ground, and a bridge element that is disposed between and electrically coupled to the first and second initiator terminals,
    charging the first capacitor terminal while grounding the second capacitor terminal along a ground path that includes the first initiator terminal, the bridge element and the second initiator terminal;
    operating the first transistor to couple the first capacitor terminal to the electrical ground such that electrical power stored in the first capacitor is discharged through the first capacitor terminal of the first capacitor and the first transistor to the electrical ground to thereby cause electrical power to flow from the electrical ground through the bridge element and vaporize the bridge element.

13. The method of claim 12, wherein the firing circuit further comprises a transformer and a second transistor, the transformer including a primary coil and a secondary coil, the primary coil having a positive lead and a negative lead, and wherein operating the first transistor comprises:
    applying low-voltage DC power to the positive lead of the primary coil, and operating the second transistor to electrically couple the negative lead of the transformer to the electrical ground to cause the secondary coil of the transformer to output power to the first transistor, wherein the power output to the first transistor drives the first transistor into a state that permits the electrical power stored in the first capacitor to be transmitted through the first transistor to the electrical ground.

14. The method of claim 13, wherein the firing circuit further comprises a second capacitor that includes a third capacitor terminal and a fourth capacitor terminal, the third capacitor terminal being electrically coupled to the positive leg of the primary coil, the fourth capacitor terminal being electrically coupled to the electrical ground, and wherein prior to operating the second transistor to electrically couple the negative lead of the transformer to the electrical ground the method comprises charging the third capacitor terminal of the second capacitor.

* * * * *